United States Patent [19]
McCoy

[11] Patent Number: 4,775,845
[45] Date of Patent: Oct. 4, 1988

[54] MICROWAVE OSCILLATOR WITH EXTERNAL FEEDBACK

[76] Inventor: Jody A. McCoy, 2501 Wickersham La. #1022, Austin, Tex. 78741

[21] Appl. No.: 41,986

[22] Filed: Apr. 24, 1987

[51] Int. Cl.$^4$ ............................ H03B 5/00; H03B 5/18
[52] U.S. Cl. ................................ 331/96; 331/107 SL; 331/109; 331/117 D; 331/117 FE; 331/179
[58] Field of Search ............. 331/96, 107 R, 107 DP, 331/107 SL, 108 R, 109, 117 R, 117 FE, 117 D, 177 R, 179, 183

[56] References Cited

U.S. PATENT DOCUMENTS

| | | | |
|---|---|---|---|
| 3,393,378 | 7/1968 | Bene et al. | 331/117 D |
| 3,699,475 | 10/1972 | Rogers | 331/117 D X |
| 4,096,453 | 6/1978 | Rogers | 331/117 D |
| 4,328,470 | 5/1982 | Bumgardner | 332/9 T |
| 4,411,018 | 10/1983 | Amoroso, Jr. | 455/24 X |
| 4,555,678 | 11/1985 | Galani et al. | 331/1 A |
| 4,577,165 | 3/1986 | Uehara | 331/116 R X |
| 4,649,354 | 3/1987 | Khanna | 331/117 FE X |
| 4,692,714 | 9/1987 | Galani | 331/96 X |
| 4,695,809 | 9/1987 | Rudelle | 331/117 FE X |

*Primary Examiner*—Eugene R. LaRoche
*Assistant Examiner*—David Mis

[57] ABSTRACT

The present invention provides an alternative circuit for microwave oscillators. The invention consists of an amplifier, signal divider, filter(s), and optional limiter. The feedback path is external to the amplifier, allowing direct access and control of the loop phase and loop gain. Control of the loop gain can be used for applications such as amplitude modulation of the oscillator's output or control of the oscillator's output power. Control of the loop phase can be used to frequency modulate the oscillator or to create a voltage-controlled oscillator. Dynamic control of the loop gain with a limiter enables one to maintain linear operation throughout the oscillator. Linear operation is often desirable to eliminate the 1/f noise contributions at the frequency of operation and to enable the use of small signal s-parameters in the design and analysis.

20 Claims, 7 Drawing Sheets

MICROWAVE OSCILLATOR WITH EXTERNAL FEEDBACK

FIELD OF THE INVENTION

The present invention relates to techniques for linearizing microwave oscillators, for providing access to and control of the loop gain and the loop phase of microwave oscillators, for improving the accuracy of their design (thus reducing or eliminating post-tuning), and for providing a microwave oscillator-modulator from a single active device. The present invention utilizes external feedback which provides significant advantages over prior microwave oscillators.

BACKGROUND

Present Oscillator Problems

All radar systems and virtually all communication systems contain microwave oscillators. The conventional microwave oscillator's noise performance is only moderate, often limiting the entire system's performance. Accurately predicting the performance of the oscillator is often difficult, since the loop phase and loop gain are obscure. Consequently. with the oscillator as the performance limiting factor, the system's performance is usually not known until it has been built and tested. As a result post-tuning of the oscillator and possibly the rest of the system is usually required.

Regarding the conventional microwave oscillator, two major areas exist which cause the above problems and cause other design and performance problems. These areas of concern are the nonlinear operation of the oscillator and the internal feedback path within the amplifier section of the oscillator.

All oscillators contain amplifiers which are used to build up and sustain oscillation. These amplifiers inherently possess low-frequency noise known as 1/f or flicker noise. This noise is well below the frequency of operation and is not a problem in the linear region of the amplifier. However, in conventional microwave oscillators, the linear region of the amplifier must be exceeded to limit the level of oscillation. Operating the amplifier in the nonlinear region causes an upconversion of the low-frequency noise analagous to the upconversion of audio to a carrier frequency in communication circuits. This noise is now centered around the operating frequency and impedes the performance of the oscillator. Occe the noise is upconverted, it cannot be filtered without attenuating the desired signal as well. To prevent this noise from appearing at the oscillator's output, one must eliminate the nonlinearities present within the oscillator.

Nonlinearities can be eliminated by dynamically controlling the loop gain and thereby restricting the active device within the amplifier to its linear region of operation. However, the conventional oscillator has an internal feedback path that is inaccessable. Therefore loop gain cannot be independently controlled and the conventional oscillator cannot be used to implement a linear oscillator. This poses a major obstacle in improving noise performance. The inaccessible feedback path also causes the difficulty of predicting the oscillator's performance. Since the loop phase and the loop gain information are both obscure, the phase vs. frequency slope and the oscillator's bandpass response cannot be accurately determined. Thus, not only can the oscillator's noise performance not be improved, it cannot even be accurately estimated with the conventional oscillator.

Problems in design accuracy are also encountered due to the nonlinear operation. To account for nonlinearities, one must estimate and use large-signal S-parameters when designing. Since the values of the S-parameters will change as they enter and leave the nonlinear regions of the amplifier, these estimations are average (rather than actual) values. Although large-signal S-parameters do simplify the design process, they also reduce the accuracy of the design and noise performance predictions. As a result, oscillation often occurs at a frequency above or below the expected frequency, thus requiring post-tuning.

Other problems which exist in conventional microwave oscillators include:
the inability to produce a wide-band oscillator due to the inability to provide a amplifier which is unstable over a wide frequency range,
poor FM noise performance at higher frequencies due to a drop in Q and thus lower phase vs. frequency slopes at the higher frequencies, and
the inability to produce monolithic low-noise oscillators due to the excessive flicker noise in GaAs MESFETs.

Prior Art

U.S. Pat. No. 3,393,378 describes a microwave oscillator similar in nature to FIG. 2, with he exclusion of the filter, 4A. However, this oscillator was later abandoned by the inventor as described in his later patent, U.S. Pat. No. 3,699,475. The reasons given for the abandonment were the inability to insert a tuning cavity into the feedback network and the inability to frequency modulate the oscillator. The present invention does not experience these problems.

With exception of the present invention, all microwave oscillators, known to the inventor to be in current use, are substantially similar in design and nature to FIG. 1. The oscillator of FIG. 1 utilizes the unstable regions of the amplifier to create oscillation. The resonator, 1, initiates the oscillation by providing a small signal of the resonant frequency. This signal is amplified in 2 and passed to the matching network, 3. The matching network, 3, allows part of the signal to pass through to the output while reflecting the rest of the signal back through the amplifier, 2, to the resonator, 1. If the reflected energy is large enough to allow the resonator's signal level to increase, the amplifier is unstable, and the result is an oscillator. Note that the reflected signal is the feedback signal and that it returns through the amplifier in the reverse direction on top of the transmitted signal. In summary, the fundamental theory for sustaining oscillation in this oscillator is to provide energy to the resonator by mismatching the input of the matching network.

Relevant Patents

There are several patents that address individual performance improvements of microwave oscillators that are described in the claims below; however, they all utilize different approaches than described herein. The fundamental improvement described herein is the use of a feedback loop which is totally external (i.e., non-embedded) to the active element within the amplifier portion of the oscillator to gain access to and control of the loop gain and loop phase.

U.S. Pat. No. 3,393,378 describes an oscillator which is similar in nature to FIG. 2; however, does not include the filter (4A), as previously stated. The present invention is an improvement in that the loop gain and loop phase are both adversely affected by the filter at frequencies other than the operating frequency, thus reducing the noise created by the other frequencies. The present invention is also an improvement over the prior oscillator for its additional abilities, including filter multiplexing, controllable output power, linear operation, and am and fm modulation.

U.S. Pat. Nos. 3,699,475 and 4,096,453 describe a specific feedback arrangement for causing a microwave transistor to oscillate. This feedback arrangement utilizes sections of distributed-element transmission lines described by their even and odd mode characterisitics and is not external feedback as defined in this patent. This arrangement provides a means of some degree of frequency tuning and power output peaking. It does not provide for variable power output control as claimed herein. More significantly, it does not provide for constraining the operating point of the active devices to remain in the linear region of its operating characteristics.

U.S. Pat. No. 4,555,678 contains an improvement in a microwave oscillator using a GaAs FET transistor that incorporates an external phase detector, a high Q resonator and means for feeding back signals out of the phase detector to degenerate low-frequency noise. This is an approach to minimize the effect of low-frequency noise, but it does not eliminate its upconversion arising from the nonlinear operating characteristics of the active device. The improvements cited herein allow for the elimination of the upconversion of low-frequency noise by restricting the active device to its linear region.

U.S. Pat. No. 4,411,018 describes a single channel push-to-talk transceiver that contains a switch controlled oscillator for generating the carrier frequency during transmission and a continuously operating local oscillator for demodulation of a received signal. U.S. Pat. No. 4,328,470 describes a high efficiency modulator circuit for modulating a microwave oscillator. The modulating circuit uses a microwave transistor that then controls an impatt diode oscillator. The claims sited herein allow a microwave signal to be generated and modulated as well, using a single active microwave device for generating the carrier as well as the modulation function. This can be done by designing the amplifier with a dual-gate FET and using the second gate of the FET as the modulation signal input.

U.S. Pat. No. 4,577,165 describes a microwave oscillator with power amplifier having automatic power control. This improvement incorporates a crystal and amplifier as the oscillator stage, and a separate amplification element whose bias voltage is controlled by a control stage. The present invention is an improvement in that the power is controlled within the oscillator eliminating the separate amplification element. Furthermore, the present invention concerns microwave oscillators, not frequencies at which crystals can be used.

None of the inventions described in the patents cited above provide, incorporate, or utilize exclusively external feedback for the purpose of loop gain and loop phase access and/or control as do the improvements cited in the claims below. Any microwave oscillator that relies on reflected energy passing back through the amplifier to the resonator in order to sustain oscillation, or a microwave oscillator in which feedback energy and signal energy must exist on the same electrical path in order to sustain oscillation is not equivalent to the claims cited herein.

SUMMARY OF THE INVENTION

As previously stated, the fundamental improvement of the present invention is the use of a feedback loop which is totally external (i.e., non-embedded) to the active device within the amplifier portion of the microwave oscillator. Feedback internal to the active element of the amplifier is not used in causing the active device to oscillate. As a result, the operating point of the active device (typically a single or dual-gate microwave FET) can be controlled and forced to remain in the linear portion of its operating region, thereby avoiding the 1/f noise contributions due to the upconversion of low frequency noise caused by nonlinear operating conditions. In fact, this operating point can be controlled to adjust the oscillator power output and/or to create an amplitude modulation of the oscillator output. Using a dual-gate FET, for example, an amplitude modulated carrier can be produced with one active device. The non-embedded feedback loop produces two major advantages. The first is the direct access to and the independent control of the loop phase and loop gain. The second advantage is actually a consequence of the first and is the ability to linearize the oscillator by dynamically controlling the loop gain (which can now be independently controlled).

The advantages over the conventional oscillator of having direct access and control of the loop gain and loop phase include:
- the ability to accurately predict the phase vs. frequency slope of the oscillator and thereby achieving the ability to determine the amount of FM noise which will occur as a result of inherent phase noise,
- the ability to increase the phase vs. frequency slope and further reduce FM noise by simply adding integer wavelengths of delay within the feedback loop,
- the ability to use conventional amplifiers and amplifier techniques since the amplifier operates in the stable region,
- the ability to verify at a glance that oscillation is not possible at frequencies other than the intended frequency of operation,
- the ability to construct a multiple frequency oscillator from a single amplifier by multiplexing filters of differing center frequencies,
- the ability to create a voltage-controlled oscillator with either a voltaged-controlled filter or a voltage-controlled phase shifter since a change in either the loop phase or the loop gain will change the frequency of operation,
- the ability to create an amplitude-modulated carrier from a single active device and with no additional circuitry, by modulating the gain of the amplifier.
- the ability to create a frequency-modulated carrier with the addition of only a phase shifter in the feedback loop, and
- the ability to control the output power of the oscillator by adjusting the loop gain of the oscillator.

The advantages over the conventional oscillator by linearizing the oscillator include:
- no estimation of the large-signal S-parameters is necessary, allowing the oscillator to be accurately designed with small signal s-parameters, low-frequency flicker noise is virtually eliminated by linear operation, harmonics created by nonlinear amplification are eliminated, low-noise monolithic oscillators may be produced with GaAs MESFETs in spite of their poor flicker noise performance, prediction and control of the exact final dc operating point is inherent and is often desirable for noise and power output criteria, and the exact power output may be directly predicted since the precise bias point is known.

DETAILED DESCRIPTION

Microwave Oscillator of the Present Invention

Figure 1:
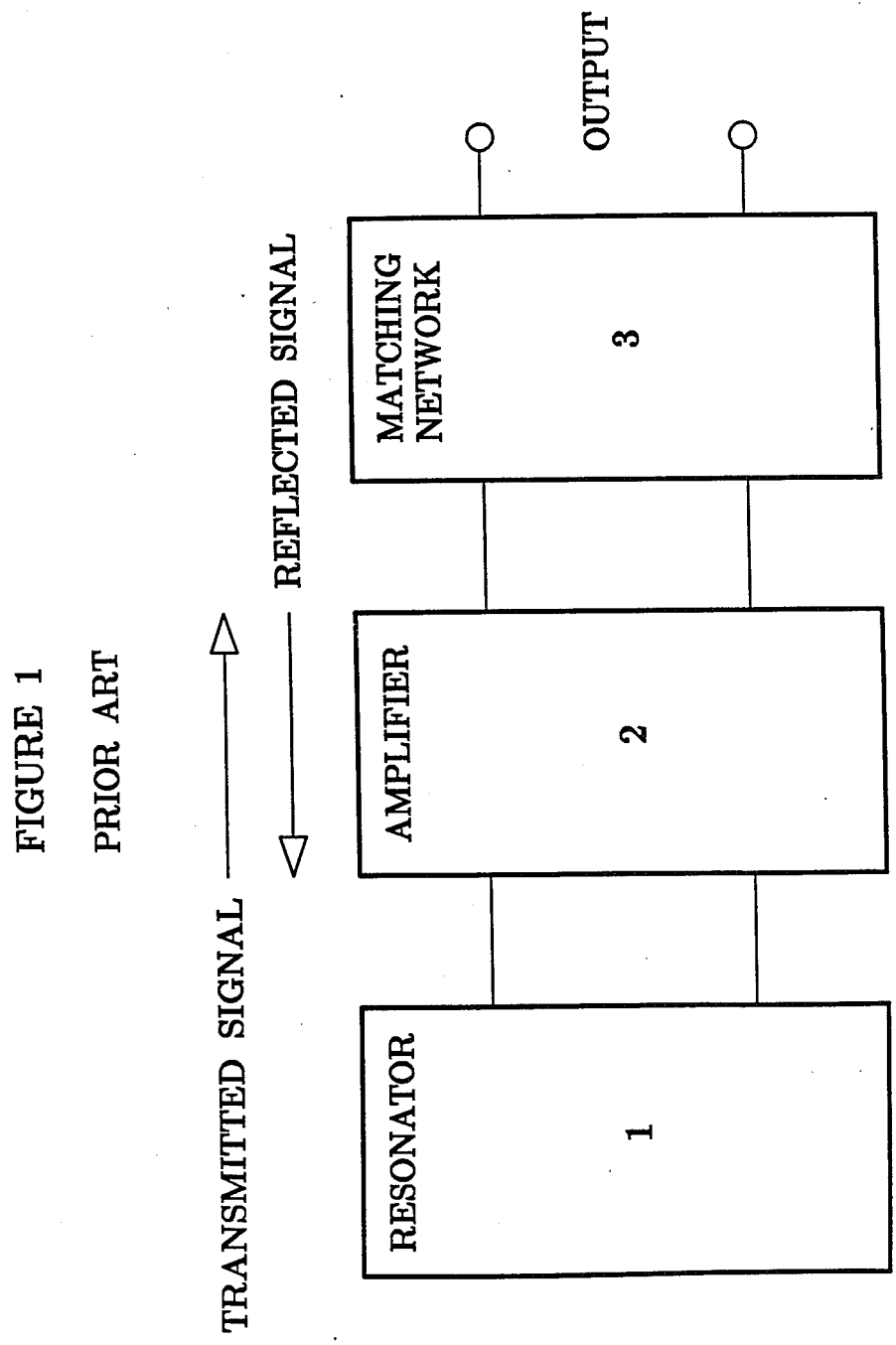
FIG. 1 is a simplified block diagram of the microwave oscillator of prior art (with internal feedback path).
Figure 2:
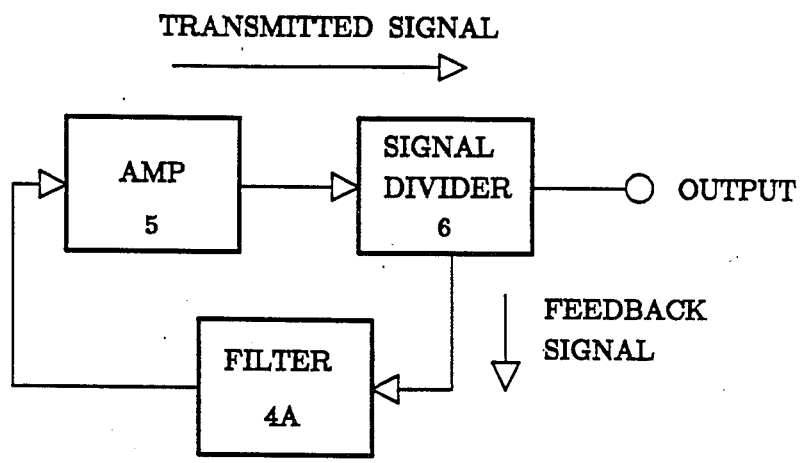
FIG. 2 is a simplified block diagram of the microwave oscillator with external feedback and single filter according to the present invention.

FIG. 2 illustrates the microwave oscillator according to the present invention. This oscillator provides easy access to the feedback loop by rerouting the feedback signal around the amplifier, providing loop gain and loop phase access and information. Transmission line lengths between the function blocks 4a, 5, and 6, are designed to provide a total loop phase which is an integer multiple of 360 degrees. The present invention provides for further FM noise reduction achievable by simply increasing the overall line length by integer wavelengths. This is actually time delaying the feedback signal for an integer number of time periods, where the time period is equal to one over the frequency of operation. The amount of feedback in 6 is usually set to provide unity loop gain at the amplifier's desired bias point, since the gain of the active device within the amplifier is usually bias dependent. This bias point can be selected for maximum signal swing, minimim noise figure, or other common criteria in oscillator design. The filter, 4a, is used to attenuate undesired feedback signals while allowing the desired microwave signal to be fed back to the amplifier.

Figure 3:
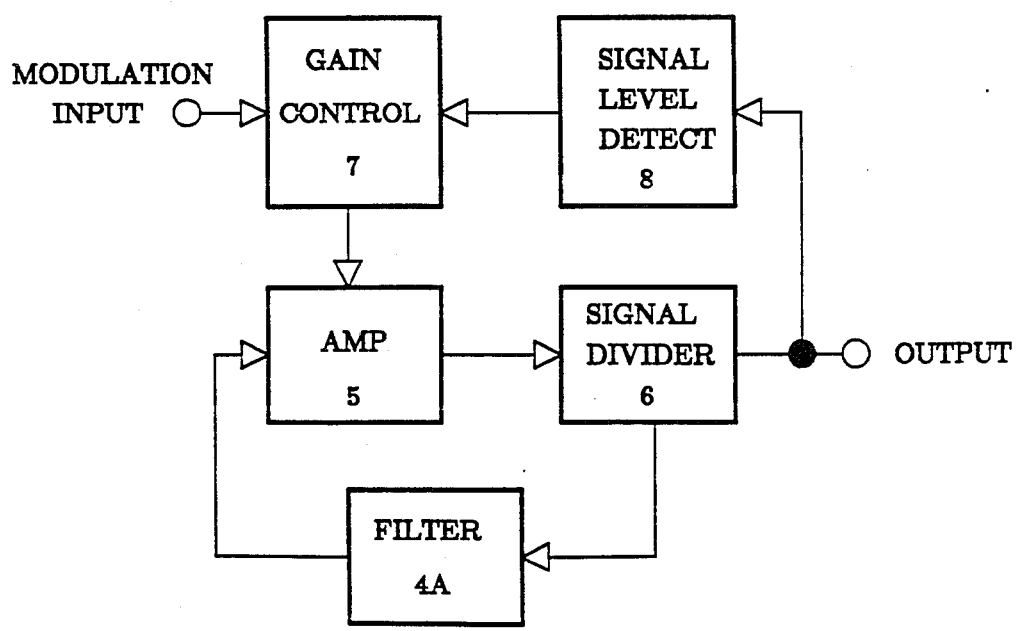
FIG. 3 is a simplified block diagram of the microwave oscillator of FIG. 2 with the addition of an optional limiter (comprised of a signal level detector and a gain control circuit) for linearizing the oscillator, modulating the oscillator, and/or controlling the output power, according to the present invention.

The microwave oscillator of the present invention will provide a stable predictable oscillator without (FIG. 2), or with (FIG. 3) the gain control, 7, and signal level detector, 8. Without the gain control and signal level detector, 'soft' limiting of the amplifier can be achieved resulting in a simpler oscillator at the cost of a partial performance reduction. The gain control and signal level detector, as shown in FIG. 3, comprise a 'limiter' which monitors the oscillator's output signal level and controls the amplifier's gain to maintain linear operation within the amplifier, as claimed below. Recall that the linear operation will eliminate the upconversion of the flicker noise and allow small-signal s-parameters to be used.

The signal level detector outputs a dc reference voltage or a dc reference current which is proportional to the magnitude of the output signal of the oscillator. This reference signal is fed to the gain control circuit, which alters the gain of the amplifier in response to the reference signal and/or modulation input. By changing the amplification of this reference signal before it is fed to the gain control circuit, one can change the power output of the oscillator, as claimed below. This change in power output occurs since a larger (or smaller) magnitude of power output is now required to achieve the same dc reference signal for adjusting the gain control circuit to achieve unity loop gain. In this manner, one can selectively alter the amplification of the dc reference signal to achieve linear operation with maximum signal swing, if desired.

Another aspect of the gain control circuit is to sum an input signal together with the dc reference signal. If an external ac signal is now applied as this input signal, it will amplitude modulate the microwave oscillator. In this way, one can achieve an oscillator-modulator with controllable output power from a single active device. One can eliminate the signal level detector, if linear operation isn't needed, leaving the gain control circuit to control the output power of the oscillator and/or to amplitude modulate the oscillator.

Figure 4:
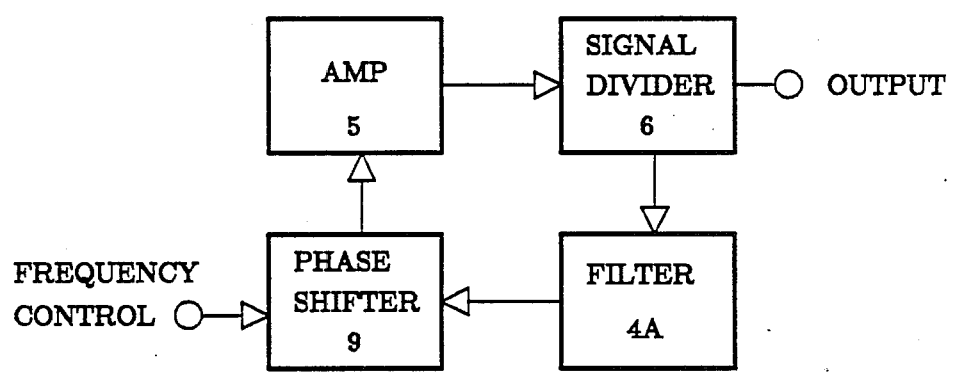
FIG. 4 is a simplified block diagram of the microwave oscillator with the inclusion of a voltage-controlled phase shifter for creating a voltaged-controlled oscillator in accordance with the present invention.

If a voltage-controlled oscillator is needed, two alternatives are provided. The first is to replace the filter, 4a, of FIG. 2 or FIG. 3 with voltage-tuned filter which changes the frequency of the oscillator as the center frequency of the filter changes, as claimed herein. A second method, which is not available in the conventional oscillator, is to add a voltage-controlled phase-shifter, 9, within the feedback loop, also claimed herein and shown in FIG. 4. As the phase changes, the frequency of the oscillator also shifts to maintain a loop phase of 360n degrees. Also, by applying an ac signal to the frequency control, the oscillator can be frequency modulated, if desired.

Multiplexing of Filters for Multiple Frequencies

Another advantage of the present invention is the ability to construct a wide-band multiple frequency oscillator with a single amplifier. Since wide band amplifiers are currently available, different filters may be switched in and out to change the operating frequency. This can greatly reduce the cost of additional operating frequencies, since additional costly amplifiers are not needed. This technique cannot be done over a wide band with the conventional oscillator because of the inability to maintain instability over a wide frequency range.

Figure 5:
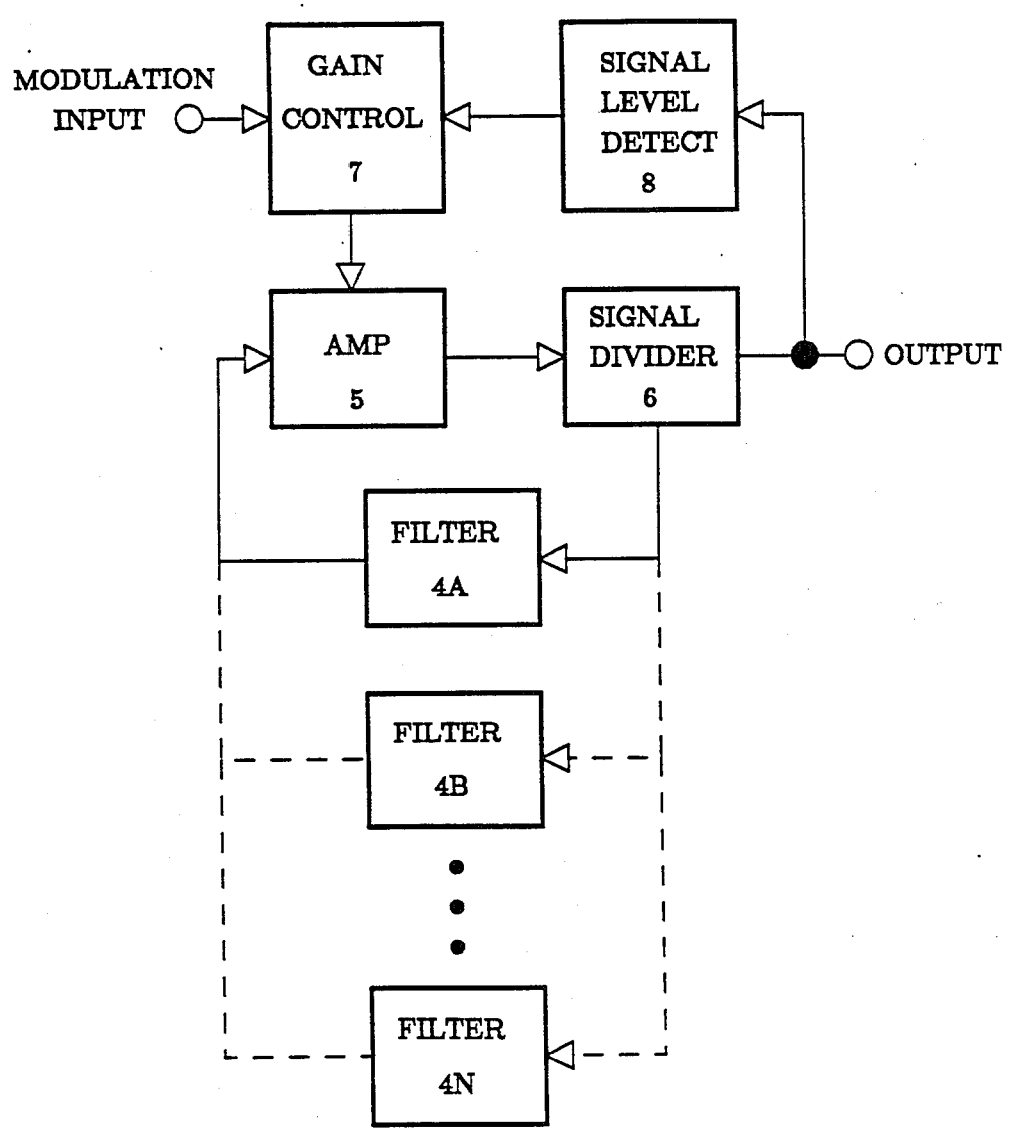
FIG. 5 is a simplified block diagram of the microwave oscillator in accordance with the present invention, with the addition of filter multiplexing for multiple frequency applications, also according to the present invention.

Referring to FIG. 5, one can see that this is simply an enhanced version of FIGS. 2 and 3. Additional filters, 4b through 4n, may be switched in and out individually to allow operation at n different frequencies. In normal operation, the filters which are not being used must provide high impedances at the points where their inputs and outputs meet the input and output, respectively, of the selected filter. A simple way to accomplish this is by using microwave switches to 'turn off' the filters which are not in use. Control voltages from a filter selector circuit can control these switches.

Example Design

Figure 6:
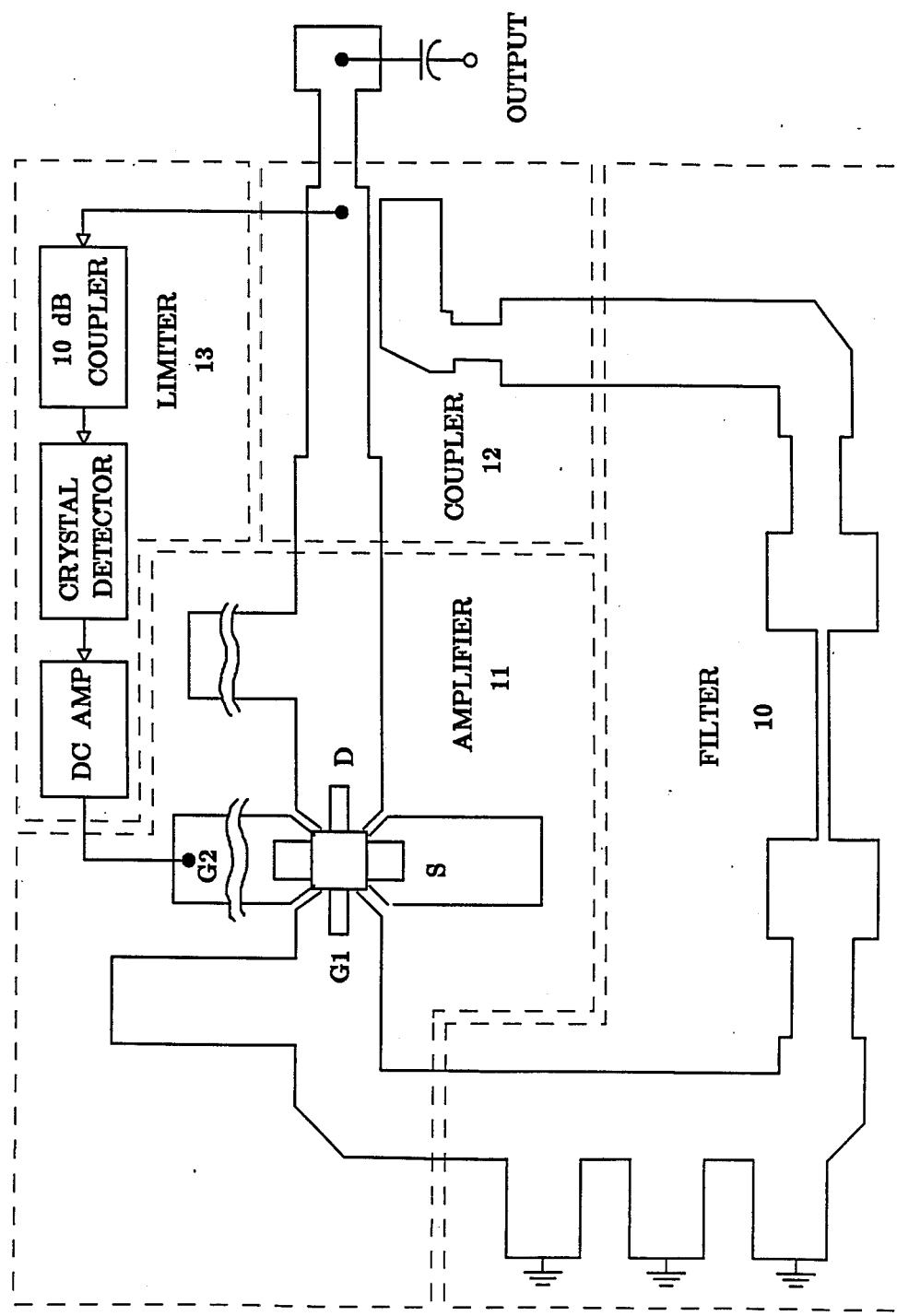
FIG. 6 is an example of one possible embodiment of the present invention using a dual-gate MESFET to create a linear microwave oscillator-modulator with controllable output power from a single active device.
Figure 7:
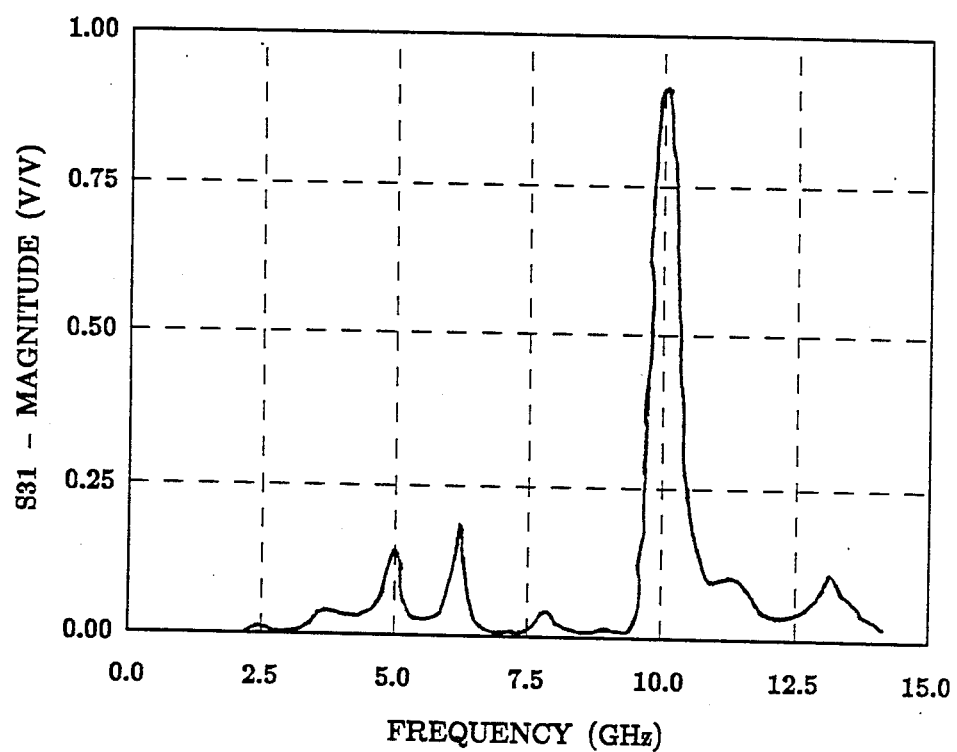
FIG. 7 illustrates the loop gain of the linear oscillator of FIG. 6 from 0 GHz to 15 GHz (at a dc bias point slightly below the final operating point) simulated with microwave CAD software.
Figure 8:
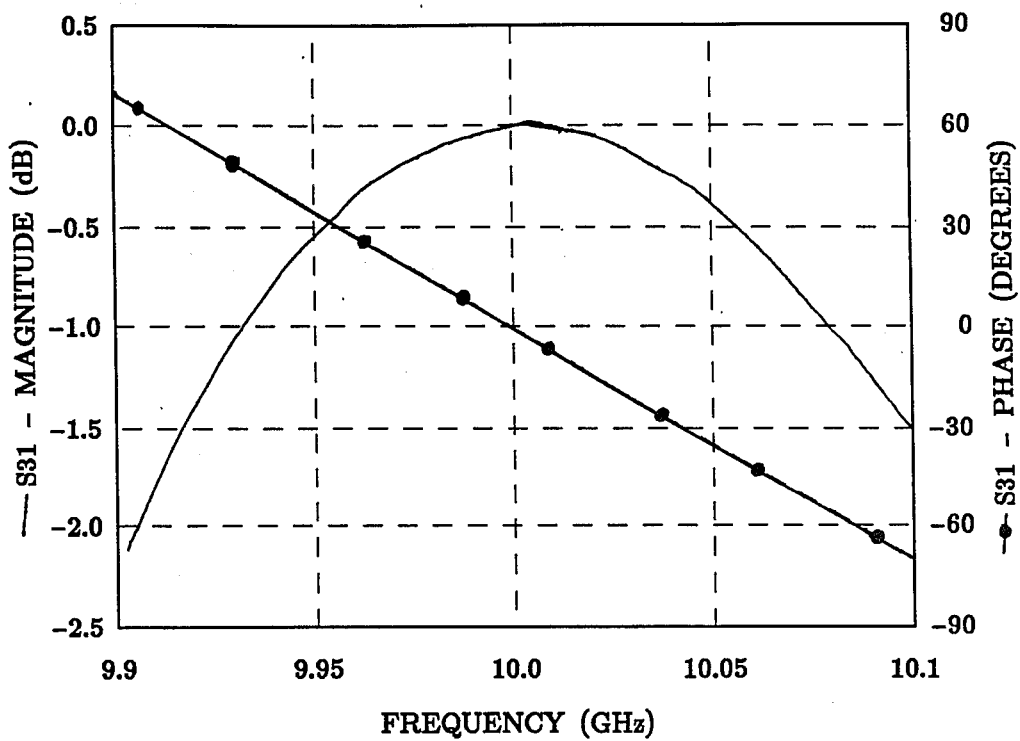
FIG. 8 illustrates the loop gain and loop phase of the linear oscillator of FIG. 6 from 9.9 GHz to 10.1 GHz at the final dc operating point, plotted from the results of computer simulations.

An example of a linear oscillator with the design of FIG. 5 has been designed with an operating frequency of 10 GHz using a dual-gate GaAs MESFET. FIG. 6 shows the layout of the final design with the dashed blocks 10, 11 and 12 corresponding to the respective blocks 4A, 5, and 6 in FIG. 5. Block 13 in FIG. 6 is the limiter which corresponds to blocks 7 and 8 in FIG. 5. Notice that this design contains a minimum of costly microwave components. Both the coupler and the filter are constructed solely of transmission lines, no microwave components. This provides savings in component costs and production time. This design was analyzed with the aid of a microwave CAD program with the resulting loop gain shown in FIG. 7 and the loop gain and loop phase shown in FIG. 8. The phase vs. frequency slope for the design was −710 degrees/GHz at the center frequency of 10 GHz with 3 dB frequencies at 9.875 GHz and 10.148 GHz corresponding to a loaded Q of 36.63.

This design can be directly used as an oscillator-modulator (i.e., combination oscillator, amplifier, and modulator) by applying the modulating signal to the second gate of the dual-gate MESFET. In this manner, three components have been incorporated into one. This dramatically reduces both the size and cost requirements. Furthermore, the output power of the oscillator can be controlled by adjusting the amplification of the dc amplifier within the limiter, 13 of FIG. 6.

Although the invention has been described in terms of the specified embodiments which are set forth in detail, it should be understood that this is by illustration only and that the invention is not necessarily limited thereto, since alternative embodiments and operating techniques will become apparent to those skilled in the art in view of the disclosure. Accordingly, modifications are contemplated which can be made without departing from the spirit of the described invention.

What is claimed or desired to be secured by Letters Patent is:

1. A microwave oscillator for generating a microwave inside a frequency range of from 0.9 gigahertz to 30 gigahertz, said oscillator comprising:
    microwave signal divider means for splitting an incoming microwave signal into two separate outgoing paths;
    a set of n filtering means for n frequency modes of operation of said oscillator, with n being a positive integer greater than unity, and each of said filtering means for attenuating undesired feedback frequencies in each of said n modes;
    a filter selecting means for controlling the connecting of one of said n filtering means into the feedback path of said oscillator; and
    microwave amplifying means for amplification of a microwave signal, said signal being derived from the output of said amplifier means and being fed back external to said amplifier means through said signal dividing means and through one of said n filtering means to the input of said amplifier means.

2. The microwave oscillator according to claim 1, further comprising:
    phase shifting means for controlling the frequency of said oscillator; and
    phase shifting adjustment means for selectively adjusting the phase of said phase shifting means.

3. The microwave oscillator according to claim 1, further comprising a phase shifting means for controlling the frequency of said oscillator, said phase shifting means having an input for frequency modulation of said oscillator's microwave signal.

4. The microwave oscillator according to claim 1, further comprising a set of n filter adjustment means, each of said filter adjustment means for selectively adjusting the center frequency of each of said n filtering means, respectively.

5. The microwave oscillator according to claim 1, further comprising a time delay means for delaying the feedback signal by an integer number of periods, said period being equal to one over the frequency of operation, and said time delay means for increasing the phase versus frequency slope of the feedback path.

6. A microwave oscillator for generating a microwave inside a frequency range of from 0.9 gigahertz to 30 gigahertz, said oscillator comprising:
    microwave signal divider means for splitting an incoming microwave signal into two separate outgoing paths;
    a set of n filtering means for n frequency modes of operation of said oscillator, with n being a positive integer, and each of said filtering means for attenuating undesired feedback frequencies in each of said n modes;
    for n greater than unity, a filter selecting means for controlling the connecting of one of said n filtering means into the feedback path of said oscillator;
    microwave amplifying means for amplification of a microwave signal, said signal being derived from the output of said amplifier means and being fed back external to said amplifier means through said signal dividing means and through one of said n filtering means to the input of said amplifier means; and
    gain control means for controlling the loop gain of said oscillator.

7. The microwave oscillator according to claim 6, wherein the gain control means is used for controlling the output power of said oscillator.

8. The microwave oscillator according to claim 6, further comprising an input to said gain control means for amplitude modulation of said oscillator's microwave signal.

9. The microwave oscillator according to claim 6, wherein the amplifier means utilizes a dual-gate FET as a means of amplification.

10. The microwave oscillator according to claim 6. further comprising:
    phase shifting means for controlling the frequency of said oscillator; and phase shifting adjustment means for selectively adjusting the phase of said phase shifting means.

11. The microwave oscillator according to claim 6, further comprising a phase shifting means for controlling the frequency of said oscillator, said phase shifting means having an input for frequency modulation of said oscillator's microwave signal.

12. A microwave oscillator for generating a microwave inside a frequency range of from 0.9 gigahertz to 30 gigahertz, said oscillator comprising:
   microwave signal divider means for splitting an incoming microwave signal into two separate outgoing paths;
   a set of n filtering means for n frequency modes of operation of said oscillator. with n being a positive integer, and each of said filtering means for attenuating undesired feedback frequencies in each of said n modes;
   for n greater than unity. a filter selecting means for controlling the connecting of one of said n filtering means into the feedback path of said oscillator;
   microwave amplifying means for amplification of a microwave signal, said signal being derived from the output of said amplifier means and being fed back external to said amplifier means through said signal dividing means and through one of said n filtering means to the input of said amplifier means;
   signal level detecting means for generating a control signal indicative of the magnitude of the microwave signal of said oscillator; and
   gain control means for controlling the loop gain of said oscillator in response to said control signal from said signal level detecting means.

13. The microwave oscillator according to claim 12, further comprising:
   second amplifying means for increasing the magnitude of the output from said signal level detecting means; and
   amplifying adjustment means for selectively adjusting the gain of second amplifying means.

14. The microwave oscillator according to claim 13, wherein the second amplifying means is adjusted to maintain linear operation in said first amplifying means.

15. The microwave oscillator according to claim 12, wherein gain control means has an input for amplitude modulation of said oscillator's microwave signal.

16. The microwave oscillator according to claim 12, further comprising:
   phase shifting means for controlling the frequency of said oscillator; and
   phase shifting adjustment means for selectively adjusting the phase of said phase shifting means.

17. The microwave oscillator according to claim 12, further comprising a phase shifting means for controlling the frequency of said oscillator, said phase shifting means having an input for frequency modulation of said oscillator's microwave signal.

18. The microwave oscillator according to claim 12, further comprising a set of n filter adjustment means, each of said filter adjustment means for selectively adjusting the center frequency of each of said n filtering means, respectively.

19. The microwave oscillator according to claim 12, wherein the amplifier means utilizes a dual-gate FET as a means of amplification.

20. The microwave oscillator according to claim 12, further comprising a time delay means for delaying the feedback signal by an integer number of periods, said period being equal to one over the frequency of operation, and said time delay means for increasing the phase versus frequency slope of the feedback path.

* * * * *